(12) United States Patent
Sheiman

(10) Patent No.: US 7,340,069 B2
(45) Date of Patent: Mar. 4, 2008

(54) SYSTEM AND METHOD FOR SPLIT AUTOMATIC GAIN CONTROL

(75) Inventor: Arthur E. Sheiman, Great Neck, NY (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 09/951,904

(22) Filed: Sep. 14, 2001

(65) Prior Publication Data

US 2003/0053641 A1 Mar. 20, 2003

(51) Int. Cl.
- *H03G 3/00* (2006.01)
- *H03G 7/00* (2006.01)
- *H03G 5/00* (2006.01)
- *H03G 9/00* (2006.01)
- *H03F 3/45* (2006.01)

(52) U.S. Cl. ............ 381/107; 381/104; 381/102; 381/109; 381/106; 381/103; 330/254

(58) Field of Classification Search ........ 381/107, 381/103, 98, 104, 102, 106, 108; 330/254
See application file for complete search history.

(56) References Cited

U.S. PATENT DOCUMENTS 4,027,264 A * 5/1977 Gutleber .................. 455/306
4,972,164 A * 11/1990 Akagiri et al. ............. 333/14
5,170,437 A * 12/1992 Strahm .................. 381/106
6,885,752 B1 * 4/2005 Chabries et al. ......... 381/321
6,940,987 B2 * 9/2005 Claesson ................. 381/107
2002/0159608 A1 * 10/2002 Fado et al. ............... 381/104

OTHER PUBLICATIONS

Applicant's admitted prior art (Figures 1A and 1B; p. 1, paragraph 0002-parge 3, paragraph 0007).*
Applicant's admitted prior art, Figures 1A, 1B, paragraphs 0002-0008).*
Applicant's Admitted Prior Art, Figures 1A-1B, paragraphs 0002-0008.*

* cited by examiner

*Primary Examiner*—Vivian Chin
*Assistant Examiner*—Devona E Faulk
(74) *Attorney, Agent, or Firm*—Grossman, Tucker, Perreault & Pfleger, PLLC

(57) ABSTRACT

A system and method for automatically controlling gain in a signal chain are presented. A first signal is processed to produce a processed signal. A gain is adjustably applied to the processed signal using an automatic gain control (AGC) mechanism. A resulting signal is produced. The gain is adjusted based on the first signal. As such, even when a desired signal is not substantially present in the first signal, gain is not excessively applied to the processed signal.

30 Claims, 5 Drawing Sheets

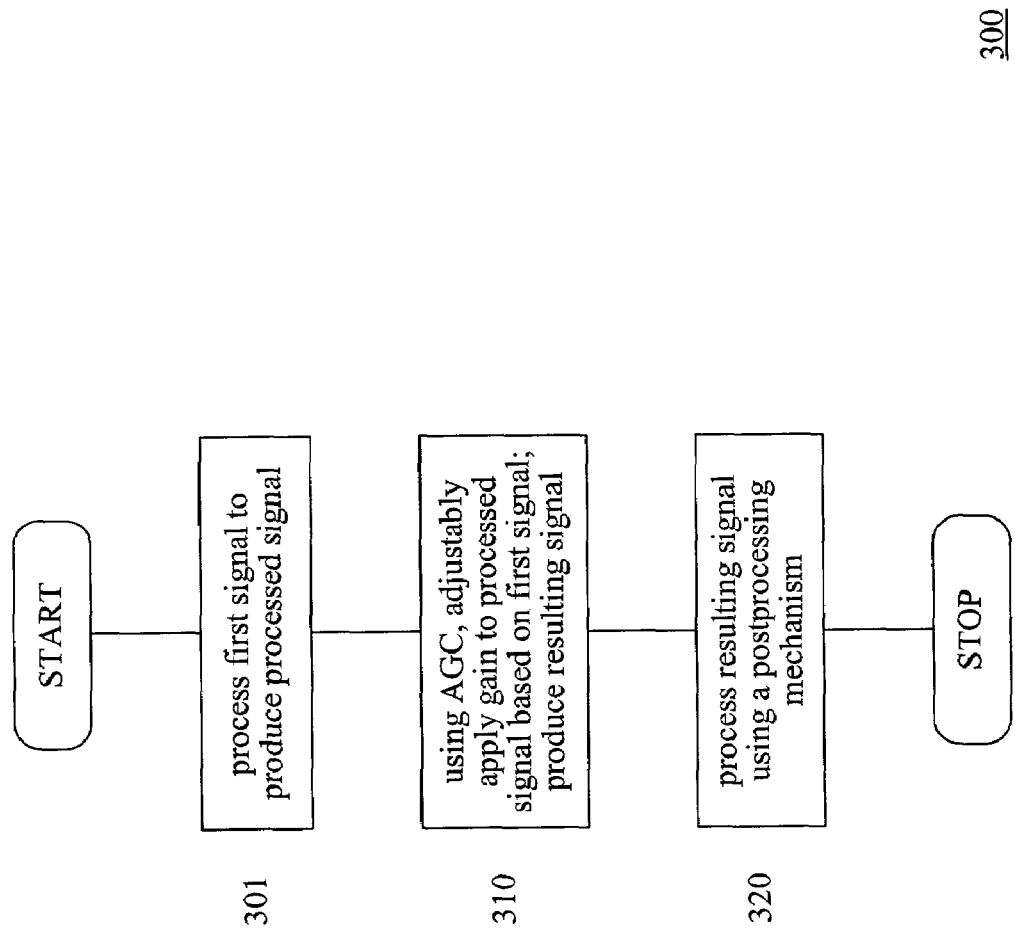

SYSTEM AND METHOD FOR SPLIT AUTOMATIC GAIN CONTROL

BACKGROUND

1. Field

This invention relates generally to automatic gain control (AGC). More specifically, this invention relates to a system and method for automatically controlling gain in a signal chain.

2. General Background and Related Art

In many signal processing applications, an input signal to a signal chain may include both desired and undesired signal components. The magnitude of a desired signal may be too small. Conversely, the magnitude of an undesired signal may be too large. Processing mechanisms, such as filters, may be employed to attenuate undesired signals. Automatic gain control (AGC) mechanisms also have been incorporated into signal chains. An AGC mechanism applies varying gains to a signal that is inputted to the AGC mechanism. As such, desired signals may be amplified sufficiently to allow for meaningful signal processing.

FIG. 1A (Prior Art) illustrates a system 100 for automatically controlling gain in a signal chain. System 100 includes a processing mechanism 140 and an AGC mechanism 180. Processing mechanism 140 includes an input 130, which receives an input signal 101, and an output 150, which outputs a processed signal 160. Input signal 101 comprises a desired signal 110 and an undesired signal 120. AGC mechanism 180 includes an input 170, which receives processed signal 160, and an output 190, which outputs an amplified signal 195.

In some applications, desired signal 110 may be present intermittently in input signal 101. As such, FIG. 1A depicts desired signal 110 with a dashed line. In a voicemail application, for example, a message may include pauses when no voice signals are present.

When desired signal 110 and undesired signal 120 are both present in input signal 101 and have approximately the same order of magnitude, as shown in FIG. 1A, system 100 performs appropriately. More specifically, processing mechanism 140 attenuates undesired signal 120 within input signal 101 so that processed signal 160 outputted by processing mechanism 140 contains a small undesired signal component 162 relative to a desired signal component 161 therein. Processed signal 160 then is presented to input 170 of AGC mechanism 180.

AGC mechanism 180 adjustably applies gain to an input signal at input 170 based on the sensed input signal. In particular, AGC mechanism 180 adjustably applies gain to processed signal 160 based on the sensed magnitude of processed signal 160. For instance, if processed signal 160 is of small magnitude, AGC mechanism 180 applies a relatively large amount of gain to processed signal 160 to ensure that a desired signal component 196 of amplified signal 195 is sufficiently large for use by the associated signal processing application. In contrast, if processed signal 160 is of large magnitude, AGC mechanism 180 applies a relatively small amount of gain to processed signal 160. Based on the adjustably applied gain, AGC mechanism 180 outputs, at output 190, amplified signal 195, which contains desired signal component 196 and undesired signal component 197.

FIG. 1B (Prior Art) shows how input signal 101 is processed when desired signal 110 is not present, or is of small magnitude relative to undesired signal 120. Processing mechanism 140 receives at input 130 input signal 101, which comprises undesired signal 120. Processing mechanism 140 then attenuates undesired signal 120 to produce a processed signal 160 at output 150. Processed signal 160 is received at input 170 of AGC mechanism 180. Because AGC mechanism 180 adjustably applies gain based upon the sensed magnitude of processed signal 160 at input 170, and because desired signal 110 is not substantially present, AGC mechanism 180 applies an increased gain to the relatively small processed signal 160, thereby producing a large amplified signal 195. Amplified signal 195 contains a large undesired signal component 197.

Therefore, implementations such as that shown in FIGS. 1A and 1B do not effectively remove undesired signals when undesired signal components are large relative to desired signal components. Although undesired signals can be attenuated by one or more processing mechanisms, a subsequent AGC mechanism excessively amplifies the attenuated signals. Excessive amplification may impair signal postprocessing mechanisms (not shown) that receive and process amplified signal 195.

Therefore, what is needed is a system and method for automatically controlling gain in a signal chain.

BRIEF DESCRIPTION OF THE DRAWINGS

FIG. 3 is a high-level flow diagram of a method according to an embodiment of the present invention.

DETAILED DESCRIPTION

The following detailed description refers to the accompanying drawings that illustrate exemplary embodiments of the present inventions. Other embodiments are possible and modifications may be made to the embodiments without departing from the spirit and scope of the invention. Therefore, the following detailed description is not meant to limit the invention. Rather, the scope of the invention is defined by the appended claims.

It will be apparent to one of ordinary skill in the art that the embodiments as described below may be implemented in many different embodiments of software, firmware, and hardware in the entities illustrated in the figures. The actual software code or specialized control hardware used to implement the present invention is not limiting of the present invention. Thus, the operation and behavior of the embodiments will be described without specific reference to the actual software code or specialized hardware components. The absence of such specific references is feasible because it is clearly understood that artisans of ordinary skill would be able to design software and control hardware to implement the embodiments of the present invention based on the description herein with only a reasonable effort and without undue experimentation.

Moreover, the processes associated with the presented embodiments may be stored in any storage device, such as, for example, a computer system (non-volatile) memory, an optical disk, magnetic tape, or magnetic disk. Furthermore, the processes may be programmed when the computer system is manufactured or via a computer-readable medium at a later date.

A system and method for automatically controlling gain in a signal chain, as presented herein, involves processing a first signal to produce a processed signal. A gain is adjustably applied to the processed signal via an automatic gain control (AGC) mechanism to produce a resulting signal. The gain is adjusted based on the first signal. As such, even when a desired signal is not substantially present in the first signal, gain is not excessively applied to the processed signal.

Figure 1A:
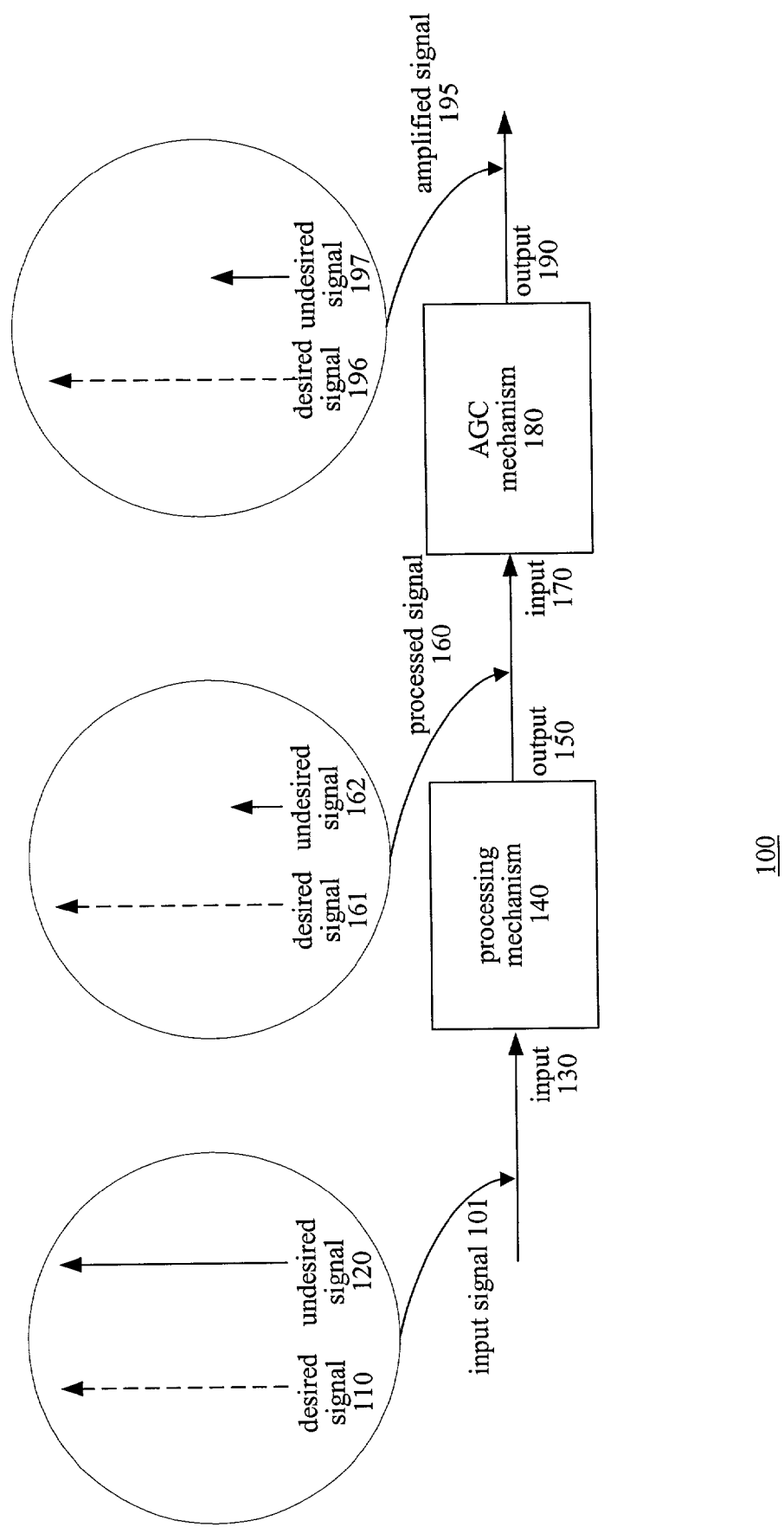
FIG. 1A (Prior Art) illustrates a system for automatically controlling gain in a signal chain.
Figure 1B:
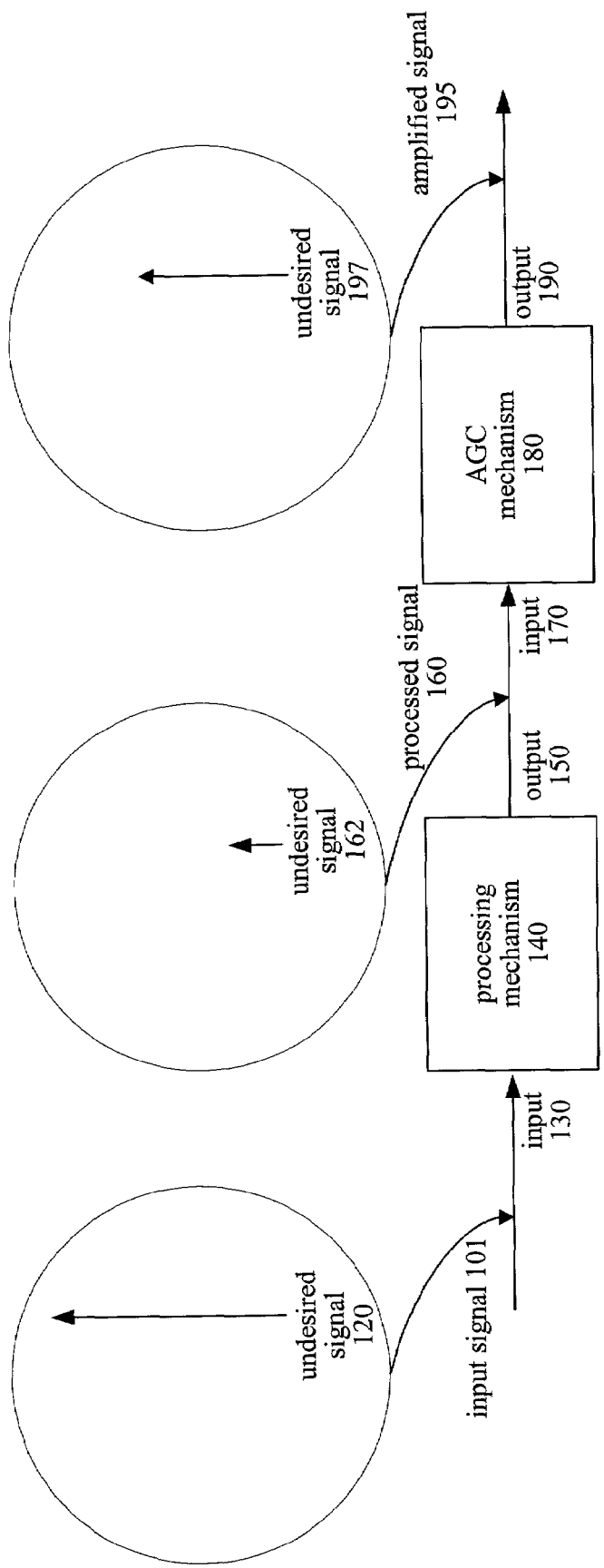
FIG. 1B (Prior Art) illustrates a system for automatically controlling gain in a signal chain.
Figure 2A:
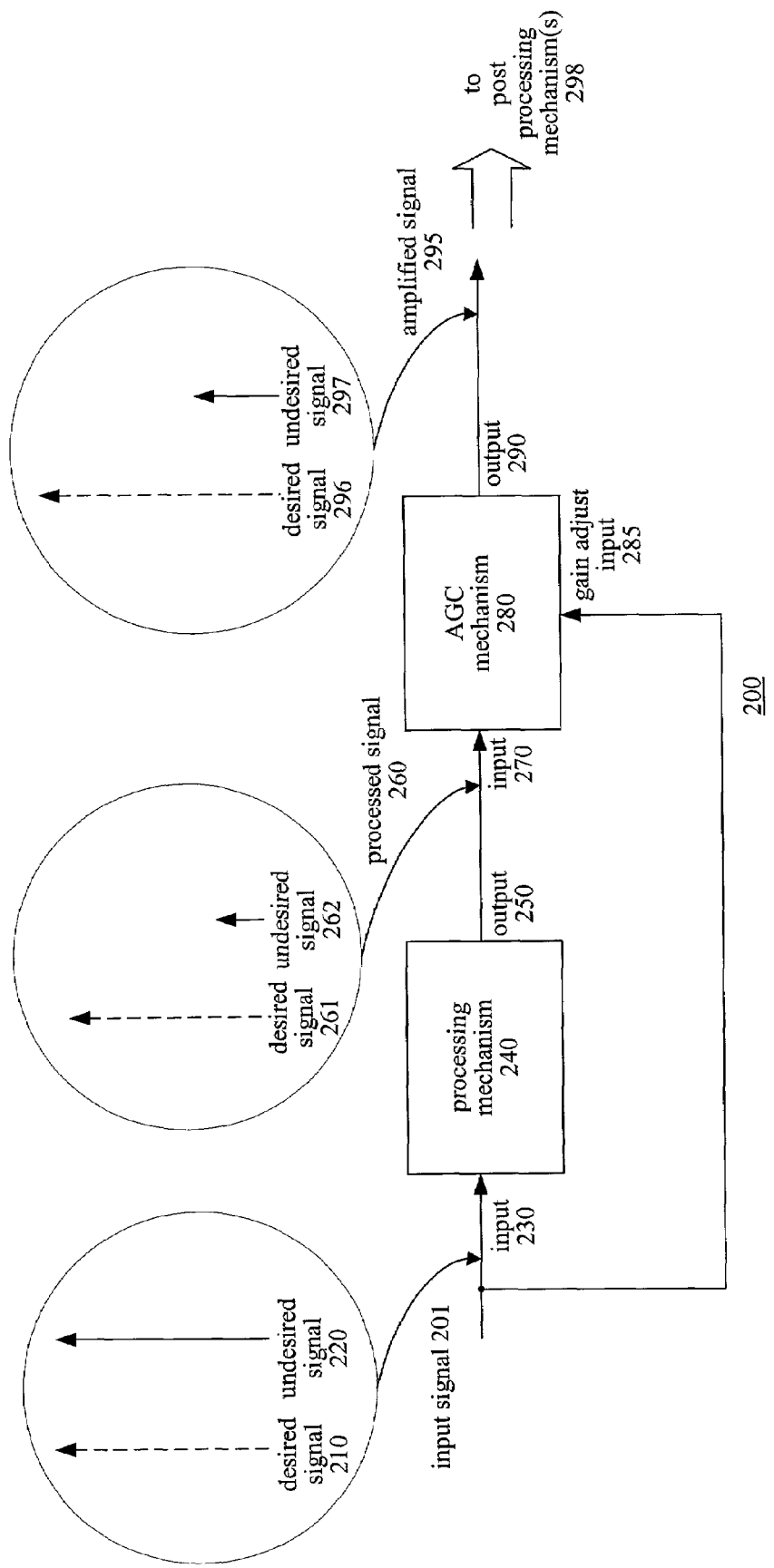
FIG. 2A is a high-level diagram of a system for automatically controlling gain in a signal chain according to an embodiment of the present invention.

FIG. 2A illustrates a system 200 for automatically controlling gain in a signal chain according to an embodiment of the present invention. System 200 includes a processing mechanism 240 and an AGC mechanism 280. It is to be noted that the functions described herein may be implemented in hardware and/or software. Specifically, processing mechanism 240 and AGC mechanism 280 may be implemented in hardware, software, or a combination thereof.

Processing mechanism 240 includes an input 230 and an output 250. Processing mechanism 240 receives an input signal 201 at input 230. Input signal 201 may comprise desired and undesired signal components, namely, desired signal 210 and undesired signal 220. In FIG. 2A, desired signal 210 is present and has approximately a same order of magnitude as undesired signal 220. However, desired signal 210 may be selectively present in input signal 201. As such, desired signal 210 is depicted with a dashed line.

Input signal 201 may include audio signals. In particular, desired signal 210 may comprise voice signals of a person speaking. Undesired signal 220 may comprise, for example, a tone or filterable noise (e.g., narrowband noise). In an exemplary implementation, system 200 may be included in a recording device associated with dictation software and/or hardware. The recording device may send a low-level pilot tone to a user to indicate that the dictation system is ready for the user to speak. When a user hears the tone, the user begins speaking. The recording device receives a combination of the user's voice signals and echoes associated with the pilot tone. The voice signals correspond to desired signal 210, and the echoes of the tone correspond to undesired signal 220. The user may speak at a low volume level, and the recording may include moments when the user is silent. Thus, in such a system, desired signals may need to be amplified, and undesired signals may need to be attenuated.

Processing mechanism 240 processes input signal 201. In one implementation, processing mechanism 240 comprises a filter, such as a notched filter, that attenuates undesired signal 220 so that it becomes small relative to desired signal 210. The attenuation may not substantially affect desired signal 210. Processing mechanism 240 outputs, at output 250, processed signal 260, which includes a desired signal component 261 and an undesired signal component 262. Depending on the processing performed by processing mechanism 240, the undesired signal component of processed signal 260, undesired signal 262, may be smaller in magnitude than the undesired signal component of input signal 201, undesired signal 220.

AGC mechanism 280 includes a split set of inputs and an output 290. Input 270 is coupled to output 250 of processing mechanism 240. As such, input 270 receives processed signal 260. Gain adjust input 285 is coupled to input 230 of processing mechanism 240. Thus, gain adjust input 285 receives input signal 201.

AGC mechanism 280 adjustably applies gain to processed signal 260 based upon input signal 201, the signal sensed at gain adjust input 285. AGC mechanism 280 outputs a resulting amplified signal 295 at output 290 of AGC mechanism 280. Amplified signal 295 comprises a desired signal component 296 and an undesired signal component 297. As illustrated in FIG. 2A, the undesired signal component 297 of amplified signal 295 is relatively small. The gain may be adjustably applied to ensure that the desired signal component 296 of amplified signal 295 is sufficiently large for postprocessing by postprocessing mechanism(s) 298, if such mechanisms are incorporated into system 200.

Figure 2B:
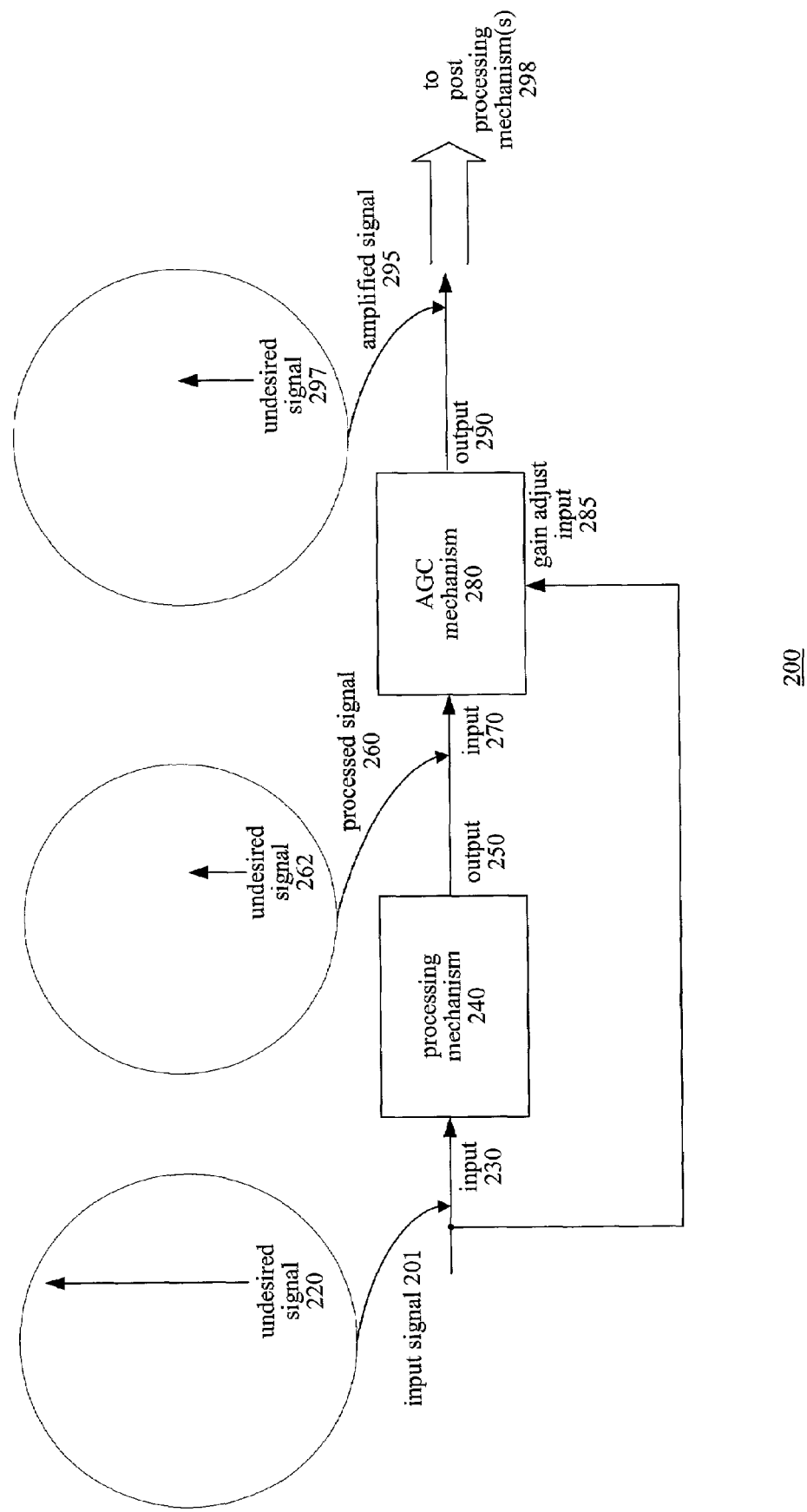
FIG. 2B is a high-level diagram of a system for automatically controlling gain in a signal chain according to an embodiment of the present invention.

FIG. 2B illustrates system 200 when desired signal 201 is not present in input signal 201 or is of small magnitude relative to undesired signal 220. Gain adjust input 285 senses a smaller signal because desired signal 201 is not present in input signal 201 or is of small magnitude therein. Accordingly, AGC mechanism 280 increases the gain applied to processed signal 260. Because AGC mechanism 280 adjustably applies gain based upon input signal 201 sensed at gain adjust input 285, not upon processed signal 260, AGC mechanism 280 does not excessively apply gain to processed signal 260. Thus, undesired signal 262 in processed signal 260 is not excessively amplified, and AGC mechanism 280 does not substantially undo the attenuation performed by processing mechanism 240.

FIG. 3 is a high-level flow diagram of a method 300 according to an embodiment of the present invention. In item 301, a first signal is processed to produce a processed signal. In item 310, using an AGC mechanism, gain is adjustably applied to the processed signal based upon the sensed first signal. A resulting signal is produced. The resulting signal is processed using a postprocessing mechanism in item 320.

The foregoing description of the preferred embodiments is provided to enable any person skilled in the art to make or use the present invention. Various modifications to these embodiments are possible, and the generic principles presented herein may be applied to other embodiments as well. For instance, communications receivers, which may receive interference tones and intermittent voice signals, may filter interference tones; the filtered interference tones should not be excessively amplified after filtering. Additionally, embodiments of the present invention may be incorporated into signal processing applications wherein a desired signal and an undesired signal are of the same order of magnitude; the desired signal is intermittent; and the undesired signal is to be attenuated by processing. Exemplary applications may include dictation systems similar to those offered by Dictaphone Corporation.

Moreover, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit.

As such, the present invention is not intended to be limited to the embodiments shown above but rather is to be accorded the widest scope consistent with the principles and novel features disclosed in any fashion herein.

What is claimed is:

1. A method for automatically controlling gain in a signal chain, comprising:

receiving an input signal at an input of a processing mechanism;

processing the input signal to produce a processed signal at an output of the processing mechanism;

receiving the processed signal at a processed signal input to an automatic gain control (AGC) mechanism and receiving the input signal at a gain adjust input of the AGC mechanism; and adjustably applying a gain to the processed signal, via the AGC mechanism, to produce a resulting signal, wherein the gain is adjusted based only on the input signal input to the processing mechanism, and not based on the processed signal output from the processing mechanism.

2. The method of claim 1, further comprising processing, by at least one postprocessing mechanism, the resulting signal.

3. The method of claim 1, wherein the unprocessed input signal comprises a desired signal component and an undesired signal component, wherein the desired signal is selectively present in the unprocessed input signal.

4. The method of claim 3, wherein the desired signal and the undesired signal have approximately equal orders of magnitude.

5. The method of claim 3, wherein the processing includes attenuating the undesired signal, the attenuating not substantially affecting the desired signal.

6. The method of claim 3, wherein the desired signal is not substantially present in the unprocessed input signal, wherein the adjustably applying the gain includes increasing the gain applied to the processed signal.

7. The method of claim 3, wherein the desired signal includes a voice signal.

8. The method of claim 3, wherein the undesired signal includes a tone.

9. The method of claim 3, wherein the signal chain is associated with a dictation mechanism.

10. A system for automatically controlling gain in a signal chain, comprising:
a processing mechanism having an input and an output, the processing mechanism being configured to receive an input signal, to process the input signal, and to output a processed signal; and
an automatic gain control (AGC) mechanism having a processed signal input and a gain adjust input and an output, the AGC processed signal input being coupled to the processed signal output from the processing mechanism, the AGC gain adjust input being coupled to the input signal input to the processing mechanism, the AGC mechanism being configured to adjustably apply a gain to the processed signal and to output a resulting signal at the AGC output, wherein the applied gain is adjusted based only on the input signal input to the processing mechanism, and not based on the processed signal output from the processing mechanism.

11. The system of claim 10, wherein the processing mechanism comprises a filter.

12. The system of claim 10, further comprising at least one postprocessing mechanism coupled to the AGC output, the processing mechanism being configured to further process the resulting signal.

13. The system of claim 10, wherein the unprocessed input signal comprises a desired signal component and an undesired signal component, wherein the desired signal is selectively present in the first signal.

14. The system of claim 13, wherein the desired signal and the undesired signal have approximately equal orders of magnitude.

15. The system of claim 13, wherein the processing mechanism is configured to attenuate the undesired signal, the attenuating not substantially affecting the desired signal.

16. The system of claim 13, wherein the desired signal is not present in the unprocessed input signal, wherein the AGC mechanism is configured to increase the gain applied to the processed signal.

17. The system of claim 13, wherein the desired signal includes a voice signal.

18. The system of claim 13, wherein the undesired signal includes a tone.

19. The system of claim 13, wherein the signal chain is associated with a dictation mechanism.

20. An automatic gain control (AGC) mechanism for a signal chain, comprising:
a processed signal input coupled to a processed signal, the processed signal being outputted by a processing mechanism configured to process an input signal;
a gain adjust input coupled to the input signal received at an input of the processing mechanism;
an output; and
a gain adjustment mechanism configured to adjustably apply a gain to the processed signal and to output the resulting signal at the output; wherein the applied gain is adjusted based only on the input signal input to the processing mechanism, and not based on the processed signal output from the processing mechanism.

21. The AGC mechanism of claim 20, wherein the unprocessed input signal comprises a desired signal component and an undesired signal component, wherein the desired signal is selectively present in the unprocessed input signal.

22. A computer-readable medium having a plurality of processor-executable instruction sequences for:
receiving an input signal at an input of a processing mechanism;
processing the input signal to produce a processed signal at an output of the processing mechanism;
receiving the processed signal at a processed signal input to an automatic gain control (AGC) mechanism and receiving the input signal at a gain adjust input of the AGC mechanism; and
adjustably applying a gain to the processed signal, via the AGC mechanism, to produce a resulting signal, wherein the gain is adjusted based only on the input signal input to the processing mechanism, and not based on the processed signal output from the processing mechanism.

23. The computer-readable medium of claim 22, further comprising processorexecutable instruction sequences for processing, by at least one postprocessing mechanism, the resulting signal.

24. The computer-readable medium of claim 22, wherein the unprocessed input signal comprises a desired signal component and an undesired signal component, wherein the desired signal is selectively present in the unprocessed input signal.

25. The computer-readable medium of claim 24, wherein the desired signal and the undesired signal have approximately equal orders of magnitude.

26. The computer-readable medium of claim 24, wherein the processing includes attenuating the undesired signal, the attenuating not substantially affecting the desired signal.

27. The computer-readable medium of claim 24, wherein the desired signal is not present in the unprocessed input signal, wherein the adjustably applying the gain includes increasing the gain applied to the processed signal.

28. The computer-readable medium of claim 24, wherein the desired signal includes a voice signal.

29. The computer-readable medium of claim 24, wherein the undesired signal includes a tone.

30. The computer-readable medium of claim 24, wherein the resulting signal is associated with a dictation mechanism.

* * * * *

UNITED STATES PATENT AND TRADEMARK OFFICE
CERTIFICATE OF CORRECTION

PATENT NO. : 7,340,069 B2 Page 1 of 1
APPLICATION NO. : 09/951904
DATED : March 4, 2008
INVENTOR(S) : Sheiman It is certified that error appears in the above-identified patent and that said Letters Patent is hereby corrected as shown below:

On the face page, item (56), under "Other Publications", in column 2, line 2, delete "parge" and insert -- paragraph --, therefor.

In column 6, line 39, in Claim 23, delete "processorexecutable" and insert -- processor-executable --, therefor.

Signed and Sealed this

First Day of July, 2008

JON W. DUDAS
*Director of the United States Patent and Trademark Office*